United States Patent [19]

Noddin et al.

[11] Patent Number: 5,276,955
[45] Date of Patent: Jan. 11, 1994

[54] MULTILAYER INTERCONNECT SYSTEM FOR AN AREA ARRAY INTERCONNECTION USING SOLID STATE DIFFUSION

[75] Inventors: David B. Noddin; Robin E. Gorrell; William G. Petefish, all of Eau Claire; Kevin L. Stumpe, Altoona; Boydd Piper, Eau Claire; Deepak N. Swamy, Eau Claire; Jimmy Leong, Eau Claire; Michael R. Leaf, Hammond, all of Wis.

[73] Assignee: Supercomputer Systems Limited Partnership, Eau Claire, Wis.

[21] Appl. No.: 868,531

[22] Filed: Apr. 14, 1992

[51] Int. Cl.[5] .................................................. H05K 3/36
[52] U.S. Cl. ........................................ 29/593; 29/831
[58] Field of Search ................ 29/830, 831, 593, 407; 174/255, 261; 361/414, 412, 416

[56] References Cited

U.S. PATENT DOCUMENTS

| | | | |
|---|---|---|---|
| 3,939,559 | 2/1976 | Fendley et al. | 29/628 |
| 3,953,924 | 5/1976 | Zachry et al. | 29/625 |
| 4,285,780 | 8/1981 | Schacter | 29/830 |
| 4,331,286 | 5/1982 | Miyazaki et al. | 228/194 |
| 4,332,341 | 6/1982 | Minetti . | |
| 4,661,204 | 4/1987 | Mathur et al. . | |
| 4,841,355 | 6/1989 | Parks . | |
| 4,864,722 | 9/1989 | Lazzarini et al. | 29/230 |
| 4,875,617 | 10/1989 | Citowsky . | |
| 4,915,981 | 4/1990 | Traskos et al. . | |
| 5,008,997 | 4/1991 | Dhy | 228/180.2 |
| 5,031,308 | 4/1991 | Yamashita et al. | 29/830 |
| 5,046,238 | 9/1991 | Daigle et al. . | |
| 5,072,075 | 12/1991 | Lee et al. | 174/264 |

OTHER PUBLICATIONS

Rogers Corporation, Fabrication of High Performance Multi-Layer Boards Using RO2800 Fluropolymer Composite Materials, 1987, 1989, 1990 Rogers Corporation, pp. 1-12.

Buene, L., *Characterization of Evaporated Gold-Tin Films*, pp. 285-295.

Tu, King-Ning and Rosenberg, Robert, *Room Temperature Interaction in Bimetallic Thin Film Couples*, Proc. 6th Intern. Vacuum Congr. 1974; Japan J. Appl. Phys. Suppl. 2, Pt. 1, 1974, pp. 633-636.

R. R. Tummala, et al, "Packaging Technology for IBM's Latest Mainframe Computers (S/390/ES9000)", presented at Electronics Components Technology Conference, May 1991, Atlanta, Ga.

(List continued on next page.)

Primary Examiner—Mark Rosenbaum
Assistant Examiner—Kenneth J. Hansen
Attorney, Agent, or Firm—Patterson & Keough

[57] ABSTRACT

A method and apparatus for manufacturing large area multilayer interconnects for electronic substrates and circuit boards uses high density area array interconnections that are created by solid state diffusion. Two or more pretested subsections are electrically and mechanically joined together to simultaneously form a multilayer substrate without employing a flow-type connection where the conductive interconnect material is entirely in a liquid phase at some point during the joining process. Each substrate is comprised of a planar dielectric substrate having a plurality of conductive layers. On at least one surface of the substrate a conductive pad lay is formed having a plurality of interconnect pads. The interconnect pads are positioned at a uniform height above the surface of the dielectric substrate and include a base metal layer, a top metal layer with at least one of the conductive pad layers have a donor metal disposed on top of the top metal layer. When the conductive pad layers of two or more subsections are aligned and stacked together, the interconnect pads can be mechanically and electrically joined together using solid state diffusion to join the donor metal layer and the top metal layer to form an area array interconnection without bonding the surrounding dielectric substrate.

29 Claims, 9 Drawing Sheets

OTHER PUBLICATIONS

D. Akihiro, et al., "Packaging Technology for the NEC SX-3/SX-X Supercomputer", presented at Electronics Components Technology Conference, May 1990, Las Vegas, Nevada.

D. J. Arthur and G. S. Swei, "Fluoropolymer Composites with Tailored Properties for High Performance Packaging", presented at 2nd Ceramic Science & Tech. Congress and American Ceramic Society's Electronics Division Meeting, Nov. 1990, Orlando, Florida.

D. J. Arthur, "Electrical and Mechanical Characteristics of Low Dielectric Constant Printed Wiring Boards", IPC Technical Review 1987, p. 10, vol. 27, No. 5.

D. J. Arthur and E. L. Kozij, "PTH Reliability of High Performance PWB Material", presented at International Electronics Packaing Society Conference, Sep. 1988, Dallas, Texas.

D. J. Arthur, et al., "Advanced Fluoropolymer Dielectrics for MCM Packaging", presented at First International Conference on MCM's, Apr. 1992, Denver, Colorado.

Mantech for Advanced Data/Signal Processing, vol. II—"Final Report for Task II VHSIC PWB Fabrication" from the Wright Research Development Center (WRDC-TR-89-8025, vol. II).

R. C. Daigle et al., "Designing Printed Wiring Boards for Reliable Leadless Ceramic Chip Carrier Interconnects", presented at Surface Mount '90 Conference, Aug. 1990, Boston, Massachusetts.

R. R. Tummala, et al. *Microelectronics Packaging Handbook*, Van Nostrand Reinhold, 1989, pp. 869–870.

N. Oki, et al, "Mounting 144PGA's on a 61 Layer, 24.5 cm Square Substrate", Nikkei Microdevices, Jun. 1989, pp. 50–55.

"Supercomputer is on One 44-Layer CPU Board", Electronics Packaging and Production, Jan. 1988, pp. 150–218.

T. Costlow, "Cray Takes Packaging to New Limits, Again", Electronics Engineering Times, Dec. 2, 1991, p. 60.

"High Performance Board Fabrication is Possible in Conventional Shape", Electronics Packaging and Production, Jun. 1991, pp. 87–88.

F. Kobayashi et al., "Hardware Technology for Hitachi M-880 Processor Group", presented at Electronic Component Technology Conference, May 1991, Atlanta, Georgia.

MULTILAYER INTERCONNECT SYSTEM FOR AN AREA ARRAY INTERCONNECTION USING SOLID STATE DIFFUSION

TECHNICAL FIELD

The present invention relates generally to area array interconnections for electronic substrates and circuit boards. More particularly, the present invention relates to a method and apparatus for manufacturing high density, multilayer area array interconnections for large area electronic substrates, circuit boards and microelectronic packages without employing a flow-type connection by using solid state diffusion such that thermally stable electrical and mechanical interconnects are formed simultaneously between multiple layers at relatively low temperatures.

PRIOR ART

The concepts involved in chip-level area array interconnections and surface mount interconnection technologies for microelectronic packages are well known in the art. The concepts involved in board-level interconnect systems and printed circuit board packaging are also well known in the art. For a background summary of package-to-board interconnections and printed-circuit board packaging techniques, reference is made to R. Tummala and E. Rymaszewski, *Microelectronics Packaging Handbook*, Chpts. 11 and 12, pp. 779-922 (1989).

State of the art high density area array interconnect systems are typically used in die-to-package or chip-to-board interconnect systems where the number of connection points per component is very large and the size of the component is relatively small. While these chip-level interconnect systems work well for relatively small components, there are many problems which prevent the techniques used in such systems from being used to create reliable, high density interconnects over a relatively large area, such as a circuit board or multichip module. In addition, the techniques used in chip-level interconnect systems are often not applicable to interconnect systems that have more than one layer of interconnects, such as for multilayer circuit boards, multichip modules and the like. Although these chip-level interconnect systems have worked well for chip-level interconnections, there is a need to develop high density area array interconnections that will work for interconnect systems having a relatively large area, such as between layers of a circuit board or multichip module, as well as interconnect systems which have multiple layers of interconnections.

The primary problem encountered in working with large area, high density multilayer interconnect systems is Z-axis tolerancing for all of the materials involved in the interconnect system. Z-axis tolerancing refers to the need for a high degree of uniformity and control in the Z-axis direction of the interconnect system. This includes the need for a high degree of planarity across the entire surface of a large area substrate in order to insure reliable and uniform connections across the hundreds or thousands of interconnect areas on such a large area substrate. Given such a large number of interconnect areas, it is almost impossible to insure complete connection between all corresponding interconnect areas on a large area substrate if the substrates are not completely level, if the height of every contact pad is not the same, or if there is uneven contact pressure across the surface of the substrates during the bonding process. Another critical factor is the need to prevent any lateral flow of the conductive material in order to avoid shorting adjacent interconnect areas. This is particularly important when there is a relatively large amount of conductive material covering a relatively large area on the substrate, for example in connecting ground planes or power planes between adjacent layers of a multilayer circuit board. In such cases, the conductive material can very easily flow laterally to short adjacent interconnect areas when the temperature and pressure of the interconnect process surpasses the liquid phase of the conductive material.

The traditional approach to high density multilayer interconnects on a circuit board-level involves a layer-by-layer buildup of the substrate with a final step that effectively fuses the entire substrate into a single integral component. For example, in a typical fiberglass circuit board where high density, multi-layer interconnects are desired, an over-sized board is created and then only a relatively small center portion of the board is used for the actual multilayer circuit board. By using only the small center portion, the problems of edge flow of the fiberglass material are less pronounced and the board is relatively planar. Even so, this technique is cumbersome, wasteful and not effective for multilayer boards with more than 8-12 layers. Another solution has been to create a multilayer ceramic circuit board by co-firing multiple layers of glass ceramics having circuit traces masked thereon to produce a single multi-layer ceramic substrate. Unfortunately, this process is very expensive for high density interconnects due to the alignment requirements during the buildup of each of the multiple layers. Still other solutions have been to bond both the dielectric material and the interconnect material of multiple layers of substrate materials together in a series of serial lamination steps, as shown for example in U.S. Pat. No. 3,953,924 or non-sequentially, as in U.S. Pat. No. 5,046,238 in order to create a multilayer substrate.

There are several problems with the traditional approach of fusing sequentially built-up layers into a single integral circuit board. First, the traditional process is typically an all-or-nothing process having a yield rate that is usually substantially less than one hundred percent. Either the circuit board was properly formed and is useable, or a fault was created somewhere internal to the substrate and the circuit board is most likely unuseable because there is typically no ability to rework the substrate once it has been fused together. In essence, this problem is caused by the inability to test the interconnects between adjacent layers in the multilayer substrate until after the final integrated substrate is formed, at which time it is generally too late to remedy any problems and the entire circuit board must be rejected, thereby lowering the yield rate of the process. As would be expected, the problem of reduced yield becomes much more significant when there are a larger numbers of layers in the circuit board. Second, the fact that the circuit board is created as a single integral substrate also becomes problematic due to the thickness of the resulting substrate when the number of layers is greater than 8-12. This is especially a problem when vias or plated through-holes are desired in the circuit board. In this situation, the mechanical problems of successfully drilling and plating hundreds or thousands of high density vias in a circuit board having more than 8-12 layers can become prohibitively expensive and technically challenging. Third, the relative processing temperatures used in creating a single integral circuit board or in joining multiple traditional circuit boards can impose severe limitations on downstream processes used as part of the process of creating and populating the completed circuit board. For example, if a flow-type electrical connection is used to join circuit materials at one point in the process, then all subsequent downstream steps must be performed at a temperature and pressure that is less than the eutectic temperature and pressure (i.e., melting point) of that conductive material. Conversely, if a flow-type connection is used to join a dielectric material at some point in the process, then all downstream steps must be performed with materials which will not deform at the temperatures and pressures needed to accomplish the flow bonding of that dielectric material.

Another class of solutions for multilayer circuit boards involves the use of what are essentially mechanical-type connections among layers in the circuit board. One such interconnect system uses an anisotropic flow-type material to create interconnections between the different layers in the circuit board. Typically, the anisotropic flow-type material is comprised of small pieces of conductive material, such as very small solder balls, that are suspended in a viscous dielectric material. When not under pressure, the viscous dielectric surrounds the small pieces of conductive material and prevents any circuit connections from being formed. When the anisotropic flow-type material is applied between layers of a circuit board and placed under pressure, typically by mechanical pressure, the material is compressed between adjacent interconnect areas and a circuit connection is formed. By definition, however, such anisotropic interconnect systems do not have uniform characteristics in the Z-axis dimension and, thus, do not address many of the problems involved in Z-axis tolerancing. Another type of interconnect system shown in U.S. Pat. No. 5,046,238 uses thousands of thin gold wires which are jammed into plated through-holes in order to create an electrical connection between multiple layers, with the mechanical stability of the multilayer circuit board being established with spacers made of a dielectric material. Still another type of mechanical-type interconnect system as shown in U.S. Pat. No. 4,841,355 uses an actual mechanical clamp to provide the contact pressure for holding multiple layers of circuit boards in electrical contact with one another.

While such mechanical-type solutions solve some of the problems associated with the reworkability and inability to test individual layers in the circuit board prior to final assembly, as well as some of the processing limitations imposed by traditional multi-layer circuit board techniques, the mechanical nature of these types of interconnect systems introduce additional problems with respect to reliability and assembly of the multilayer circuit board. In addition, the mechanical nature of the electrical connection created by such systems has a larger resistance and relatively low bond strength, as well as other electrical characteristics that are less desirable than a metallurgical bond that would be created for the electrical connection. Finally, the physical size of the supporting hardware is often a limiting factor with respect to high-density interconnect systems.

Although present high density multilayer interconnect systems are capable of forming reliable high density area array interconnections for single layers and chip-size surfaces, it would be desirable to provide an interconnect system which is capable of forming the same type of high-density area array-type of interconnections for circuit boards having relatively large areas and multiple layers of interconnects. It would also be desirable to provide a high density, multilayer interconnect system which can eliminate the problems of drilling vias and plated through-holes in very thick circuit boards having more than 8-12 layers. Additionally, it would be advantageous to provide a multilayer, high density interconnect system which would allow for pre-testing and reworking of individual layers, as well as avoiding the process limitations imposed by present flow-type interconnect systems and the reliability and performance limitations of present mechanical-type interconnect systems.

SUMMARY OF THE INVENTION

The present invention provides a method and apparatus for manufacturing large area multilayer interconnects for electronic substrates and circuit boards using high density area array interconnections. The invention allows two or more pretested subsections to be electrically and mechanically joined together to simultaneously form a multilayer substrate without employing a flow-type connection where the conductive interconnect material is entirely in a liquid phase at some point during the joining process. Each substrate is comprised of a planar dielectric substrate having a plurality of conductive layers. On at least one surface of the substrate a conductive pad layer is formed having a plurality of interconnect pads. The interconnect pads are positioned at a uniform height above the surface of the dielectric substrate and include a base metal layer, a top metal layer with at least one of the conductive pad layers having a donor metal disposed on top of the top metal layer. When the conductive pad layers of two or more subsections are aligned and stacked together, the interconnect pads can be mechanically and electrically joined together using solid state diffusion to join the donor metal layer and the top metal layer to form an area array interconnection without bonding the surrounding dielectric substrate.

By using multiple subsections which are each pretested, the problems of drilling and plating long vias in very thick circuit boards is overcome and the effective yield rate of the present invention is almost 100% because of the ability to pretest each subsection prior to final assembly of the multilayer substrate. By using solid state diffusion to join the donor metal layer and the top metal layer, thermally stable electrical and mechanical interconnects can be formed at relatively low temperatures that are effectively below the eutectic and peritetic points of the interconnect material, thereby preventing the interconnect material from creating shorts or voids in the interconnects by flowing laterally to adjacent interconnects and providing for greater flexibility in both the upstream and downstream processing of the multilayer substrate.

In the preferred embodiment, there is interposed between adjacent subsections a link layer having a plurality of link pads which selectively correspond to the interconnect pads on the conductive pad layers. The link pads include a base metal layer, a top metal layer and a donor metal layer on each surface. The link pads are surrounded by a dielectric medium which is recessed from the surface of the link pads such that the surface of the link pads is higher than the exposed surface of the dielectric medium. As a result, the link pads essentially become floating rivets that can be used to electrically and mechanically bond the interconnect areas without bonding the adjacent dielectric substrate. The advantage to using the link layer is that the conductive pad layer of the pretested subsections need not be provided with the donor metal layer, as the donor metal layer is provided by the link layer. This also allows for the donor metal layer to be added just prior to assembly of the multilayer substrate that is more easily processed and minimizes possible contamination, oxidation or pre-diffusion of the donor metal.

Another feature of the preferred embodiment of the present invention is the use of a shield pad that is defined around the periphery of each subsection. The shield pad, and associated shield link pad in the link layer, provide a large surface area that provides the majority of the mechanical strength of the bonded substrate. In addition, once the link pads are joined, the shield link pads serve to isolate the interconnect pads on the interior of the multilayer substrate from outside contamination.

In the preferred embodiment, the multilayer substrate is formed from three or more subsections that use a thermoplastic fluoropolymer composite material as the dielectric substrate. The metallurgical joints are preferably created using a solid state diffusion process to join the donor metal layer and the top metal layer without bonding the surrounding dielectric substrate. The base metal layer of the interconnect pads is Cu, and the metallurgy for the interconnect alloy is Au:Sn, with Sn being the donor metal. Because the solid state diffusion process occurs at temperatures and pressures that are essentially below the eutectic point of the interconnect alloy, the ratio Au:Sn is greater than 80:20 by weight, and is preferably approximately 97:3. For this type of alloy, the joints for the interconnects are formed between 425°–575° F. @100–2500 PSI for a period of 30–90 minutes. After the solid state diffusion process, an optional stress relaxation cycle can be used to decrease the residual mechanical stress introduced into the dielectric composite during the solid state diffusion process.

Accordingly, it is a primary objective of the present invention to provide a method and apparatus for manufacturing area array interconnections for electronic substrates and circuit boards without employing a flow-type connection.

Another objective of the present invention is to provide a method and apparatus for assembling multilayer substrates from three or more pretested subsections to increase the yield while decreasing the cost of the multilayer substrates.

Still another objective of the present invention is to provide a method and apparatus for building high density, multilayer substrates that avoids having to drill and plate long vias in a large multilayer board and provides more freedom in circuit design boards because vias do not have to be drilled all the way through the large multilayer board.

A further objective of the present invention is to provide a multilayer interconnect system for large area interconnections that provides for better electrical characteristics of the interconnects than mechanical-type interconnections.

A still further objective of the present invention it to provide a multilayer interconnect system using solid state diffusion that utilizes link layers that are less expensive to produce and can be more easily processed just prior to assembly of the multilayer substrate.

An additional objective of the present invention is to provide a multilayer interconnect system that has a shield pad to increase mechanical stability of the multilayer substrate and effectively seal off the interior region of the multilayer substrate to prevent possible contamination.

These and other objectives of the present invention will become apparent with reference to the drawings, the detailed description of the preferred embodiment and the appended claims.

DETAILED DESCRIPTION OF THE PREFERRED EMBODIMENT

Figure 1:
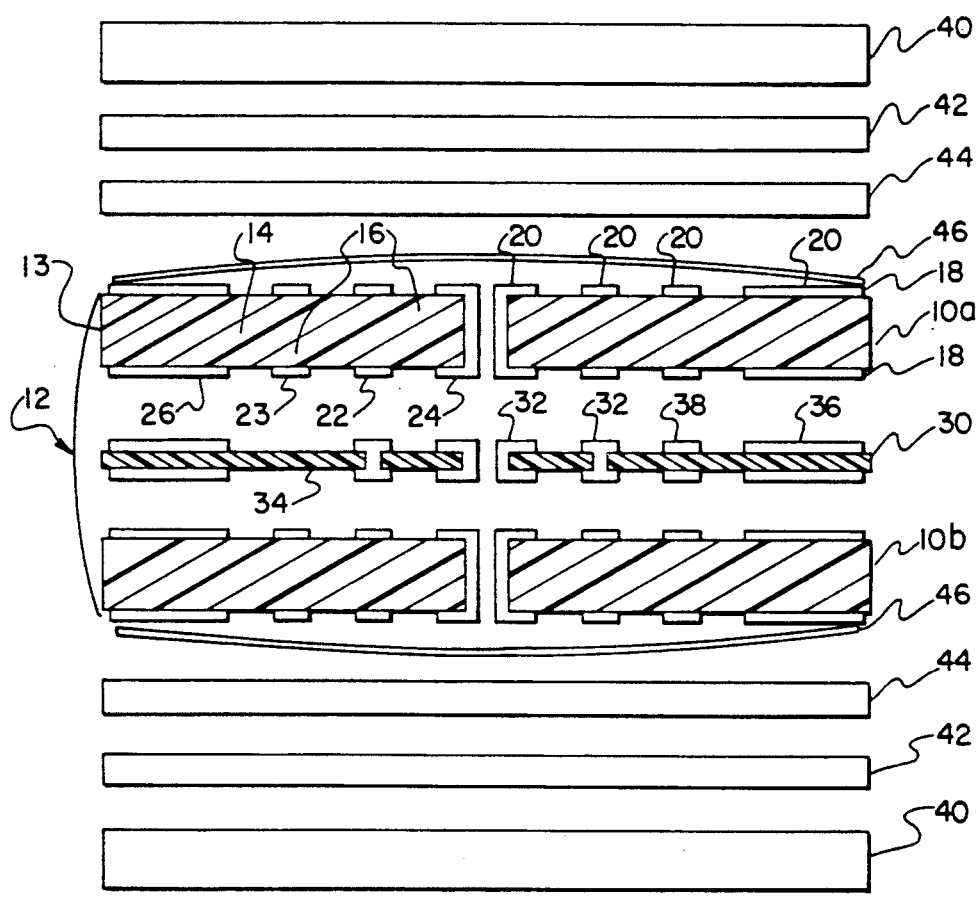
FIG. 1 is an exploded cross section of the electrical and mechanical joining of two subsections of the preferred embodiment.
Figure 2:
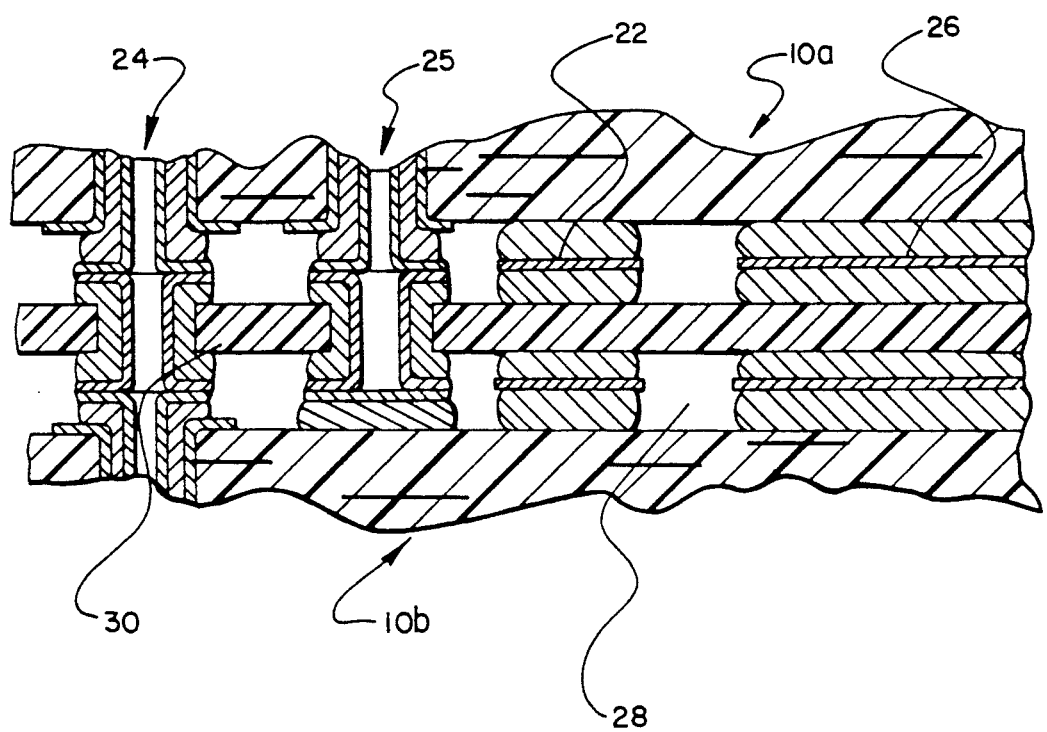
FIG. 2 is a simplified cross section of a completed substrate of the preferred embodiment.

Referring now to FIG. 1, the preferred embodiment of the apparatus of the present invention will be described. Two fully tested subsections 10a and 10b are to be electrically and mechanically joined together to form a multilayer substrate 12 in accordance with the present invention. The subsections 10 are each comprised of a planar dielectric substrate 13 having a plurality of conductive layers, including at least one power layer 14 and at least one X-Y signal pair layer 16. In general, the subsections 10 can be created using many different types of processes for forming a multilayer substrate, and each subsection 10 could have up to 5-14 layers or more. The conductive pad layer 18 has defined therein a plurality of interconnect pads 20. The interconnect pads 20 can include signal pads 22, non-signal pads 23, plated through-hole (PTH) pads 24, terminator pads 25 (as shown in FIG. 2) and shield pads 26. Typically, the signal pads 22, PTH pads 24 and terminator pads 25 will be used to selectively interconnect signal, power and ground signals between adjacent subsections 10a and 10b. The non-signal pads 23 are optional and can be used to increase the Z-axis tolerancing by providing a uniform set of contact pads for mechanical, but not electrical, connection between adjacent layers that do not have many signal interconnects therebetween. As described in greater detail hereinafter in connection with FIG. 2, the shield pads 26 are also optional and can be used to connect a larger power or ground plane between adjacent subsections 10 that also serves to surround and isolate the signal pads 22, PTH pads 24 and terminator pads 25, as well as to provide a more rigid mechanical connection for the entire subsection 12.

In the preferred embodiment, there is interposed between the adjacent subsections 10a and 10b a link layer 30 having a plurality of link pads 32 which selectively correspond to the interconnect pads 20. The link pads 32 can be of varying sizes and shapes to correspond to the interconnect pads 20 to which they are to be aligned. The link pads 32 are surrounded by a dielectric medium 34 which is recessed from the surface of the link pads 32 such that the exposed surfaces of the link pads 32 are higher than the exposed surfaces of the dielectric medium 34. The difference in height between the link pads 32 and the dielectric medium 34 is sufficient to prevent the dielectric medium 34 from bonding to the dielectric of the subsections 10 and 12 during processing in accordance with the present invention. Surrounding the link pads 32 and dielectric medium 34 are link shield pads 36 corresponding to the shield pads 26 of the subsection 10. A non-conductive link pad 38 can also serve to isolate two adjacent interconnect pads 20 by interposing the dielectric medium 34 between the non-signal pads 23, for example.

As shown in FIG. 2 which depicts a cross section of a completed substrate 12, a pair of air gaps 28 are created that serve to effectively isolate interconnect pads 20 between adjacent subsections 10a and 10b. The air gaps 28 are created because the dielectric 34 of the link layer 30 is not bonded to the subsections 10 due to the height difference between the dielectric medium 34 and the link pads 32. Although in the preferred embodiment a pair of air gaps 28 are created corresponding to each interconnection, it will be recognized that if the link layer 30 is not interposed between the subsections 10a and 10b, a height differential between the planar dielectric 13 and the interconnect pads 20 must correspond to the height difference otherwise provided by the link layer 30 and that only a single air gap 28 will be created. It will also be recognized that although the air gaps 28 are themselves a dielectric because air is a dielectric, the air gaps 28 may be filled with an inert dielectric fluid, such as FLUORINERT ® available from 3M Company, St. Paul, Minn., in order to enhance the dielectric properties of the air gaps 28.

One of the advantages of the present invention is the fact that the subsections 10 can be pretested to verify proper construction prior to assembly into a completed multilayer substrate 12. Most prior art techniques construct multilayer boards by processing all of the layers in a multilayer substrate simultaneously (e.g., multilayer ceramic boards or fiberglass circuit boards), or by serially adding each layer to the existing layers until the board is finally complete (e.g., thin film deposition, evaporation and masking techniques). Thus, while it may be possible to test individual layers, there is generally no opportunity to test the interconnections between board layers prior to joining those layers to other layers in a multilayer substrate. In contrast, the present invention allows for smaller subsections 10 comprised of at least one power layer 14 and one X-Y signal pair layer 16 and at least one pad layer 18 to be assembled into a pre-testable component which can be fully tested prior to assembly into the completed multilayer substrate 12. The difference between prior art techniques for forming a multilayer substrate and the present invention is that the conductive pad layer 18 is provided on one or both of the surfaces of the subsection 10, even though those surfaces will not be the external surfaces of the multilayer substrate 12. As a result, it is possible to test the internal interconnections using standard circuit test procedures to verify the signal and power paths within the subsection 10. It will be recognized that the testability of the subsections 10 could be extended to allow for testing of completed multilayer substrates 12 which may in turn be used as a subsection 10 for a second and subsequent assembly process in accordance with the present invention.

Although only two subsections 10a and 10b are shown, it will be recognized that multiple subsections 10 and link layers 30 can be stacked together and processed in parallel in accordance with the present invention. Unlike the alignment problems with present MLG multilayer board and PWB multilayer board construction techniques, the present invention can produce multilayer substrates 12 having twenty or more signal and power layers without requiring that all of the layers be simultaneously aligned during processing. As indicated above, the completed multilayer substrates 12 can in turn be used as subsections 10 in a subsequent process step as part of the creation of a multilayer substrate having from four to more than one hundred signal and power layers. Based on present experience with the processes of the present invention, the only upper limit on the number of subsections 10 which can be laminated together to produce multilayer substrates 12 will be the physical capacity of the heat-press and the ground rule tolerances of the signal paths through such a large multilayer substrate.

Referring again to FIG. 1, the subsections 10 and the link layer 30 are stacked together with the interconnect pads 20 and link pads 32 selectively aligned as shown to form an unjoined multilayer substrate 12 that is then placed in a conventional heat-press for applying uniform surface pressure and heat to the multilayer substrate 12 in order to accomplish the mechanical and electrical bonding of the interconnect pads 20. The heat-press will typically have a caul plate 40 and press pad 42 which selectively apply pressure to a pair of separator plates 44. To prevent sticking of the subsections 10 to the separator plates 44, a pair of thin stainless release foils 46 are interposed between the separator plates 44 and the outer surfaces of the multilayer substrate 12. In the preferred embodiment, a high temperature electrical heat-press is used to perform the bonding cycle as described in detail hereinafter, although it will be recognized that many other mechanisms could also be used to provide the heat and pressure necessary to accomplish the objectives of the present invention.

Figure 3A:
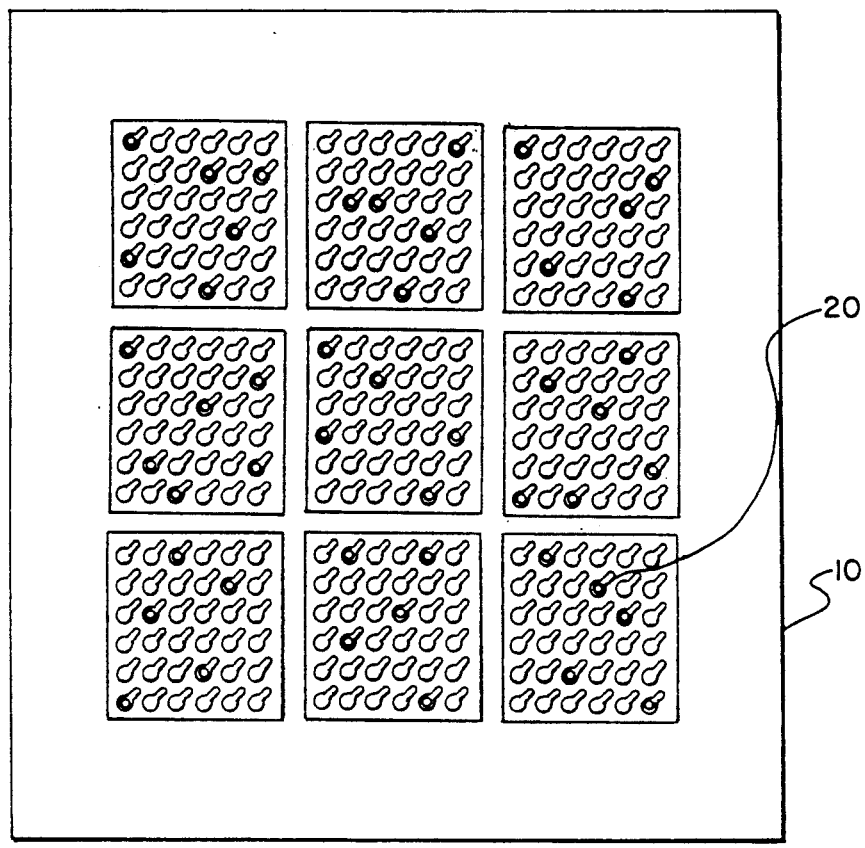
FIGS. 3a and 3b are a top plan view and a cross section side view of a completed subsection of the preferred embodiment, respectively.
Figure 3B:
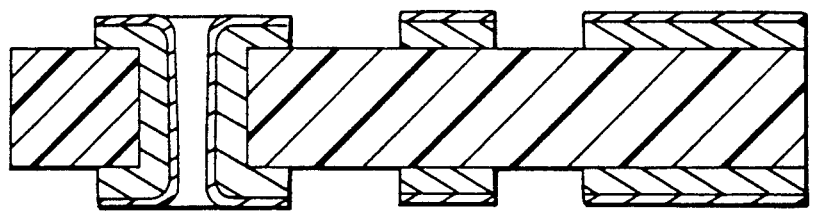

Referring now to FIGS. 3a and 3b, a top plan view and cross section side view of the preferred embodiment of one surface of the subsection 10 are shown. The interconnect pads 20 are generally hexagonal in shape, although it will be recognized that any shape may be used for a interconnect pad 20, so long as the shape is consistent and/or compatible with the shape of the adjacent interconnect pad 20 on the surface of the adjacent subsection 10 or link layer 30. It will be seen that in this embodiment the interconnect pad 20 are formed in a tab shape with one end of the tab located around the opening of the plated through-hole 27 and the other end located within the interstitial region of the plated hole grid. The tab shape may optionally be used for the terminator pads 25 as well. It has been found that the use of the tab shape for the interconnect pads 20 results in less residual mechanical stress during the processing of the present invention, particularly for the PTH interconnect pads 24 associated with the plated through-holes 27. It is believed that this advantage arises because of the differences in the compressive moduli and coefficients of thermal expansion of the planar dielectric material 13 and the metallic plated through-hole 27 which tends to impede the stress relaxation of the resulting joint when the PTH interconnect pad 24 is located above the plated through-hole 27.

Figure 4A:
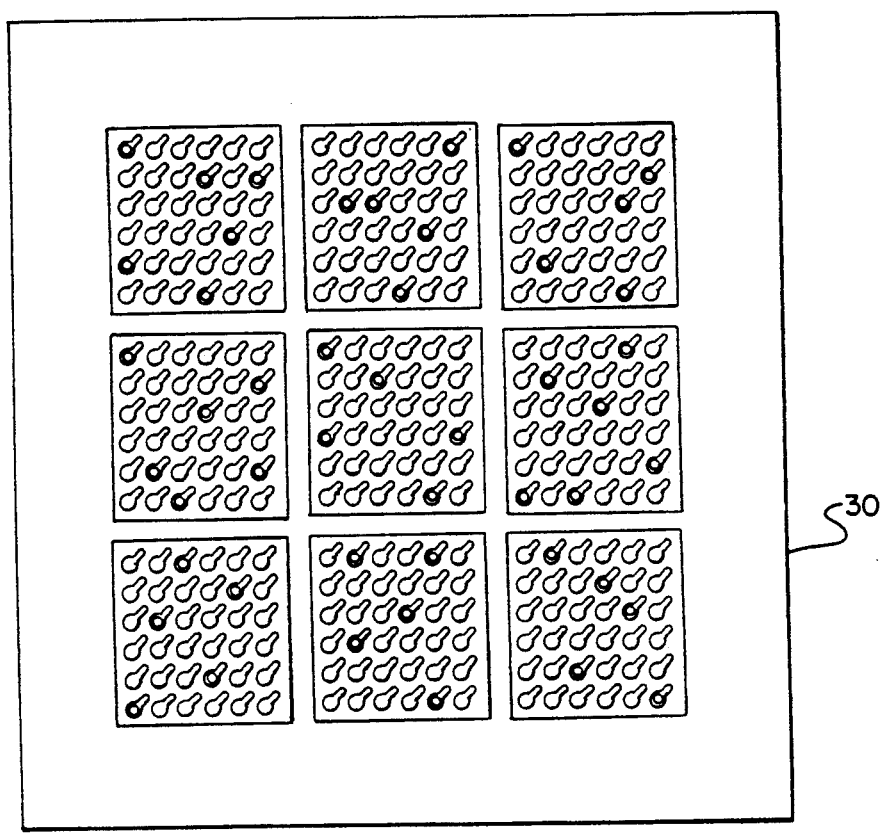
FIGS. 4a and 4b are a top plan view and a cross section side view of a link layer of the preferred embodiment, respectively.
Figure 4B:
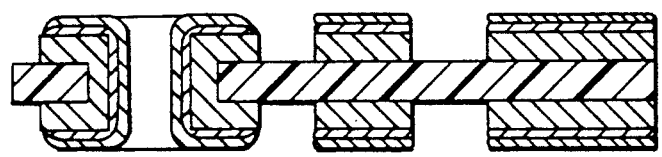

Referring now to FIGS. 4a and 4b, a top plan view and cross section side view of the preferred embodiment of the link layer 30 are shown. It will be seen that in the preferred embodiment the link pads 32 form a regular pattern corresponding to the interconnect pads 20 on the subsection 10. In essence, the link pads 32 can be thought of as "floating rivets" which are used to mechanically and electrically interconnect the subsections 10. In the preferred embodiment, interconnect pads 20 which are not to be electrically interconnected still have an associated non-conductive link pad 38 to mechanical bond with a non-signal pad 23, for example. It would also be possible to eliminate the non-conductive link pad 38 altogether at selected locations that represent areas in which no connection is desired, as shown for example at missing pad 39. The link shield pad 36 surrounds the entire region of link pads 32 and dielectric medium 34. When the link layer 30 is laminated together with the subsections 10, it will be apparent that the region containing the link pads 32 and dielectric medium 34 is effectively sealed off from outside the link shield pad 36. The isolated region created by the link shield pad 36 is advantageous because it effectively seals off the interior region from outside contaminants such as cleaners, acids, moisture and other undesired substances, and because it provides a uniform metallurgical bond between adjacent subsections 10. Another reason for using the link layer 30 is to provide a less expensive and more easily processed source of donor metal for the solid state diffusion process that is described in greater detail hereinafter in connection with FIG. 8. In this way, the interconnect pads 20 of the more expensive subsections 10 can be plated with a top surface metal that is more resistant to oxidation and other types of corrosion or contamination. As a result, the subsections 10 can have a longer shelf life prior to assembly into the multilayer substrate 12, whereas the less expensive link layers 30 can be made just prior to assembly of the multilayer substrate 12, thereby decreasing possible contamination, oxidation or pre-diffusion of the donor metal in the link layer 30. Although only a single unitary link layer 30 is shown, it will also be recognized that the link layers 30 could be comprised of two or more planar sections which would be interposed between adjacent subsections 10 in a manner such that the link layers 30 were abutting each other or were otherwise positioned to provide the link pads 32 where necessary.

Figure 5A:
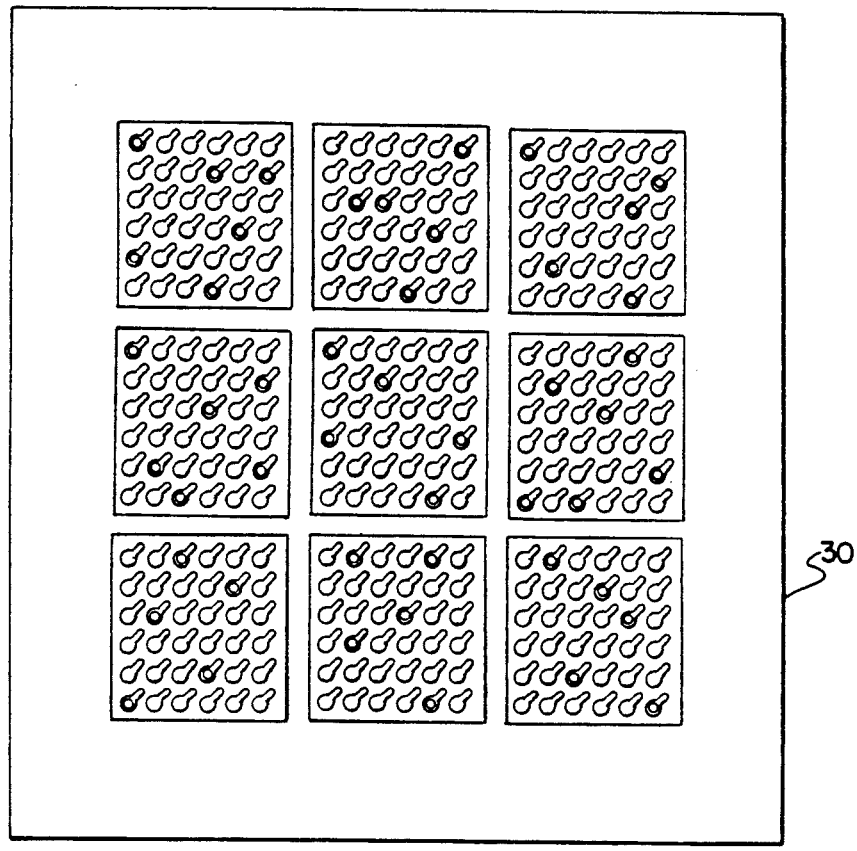
FIGS. 5a and 5b are a top plan view and a cross section side view of a link layer of an alternative embodiment, respectively.
Figure 5B:
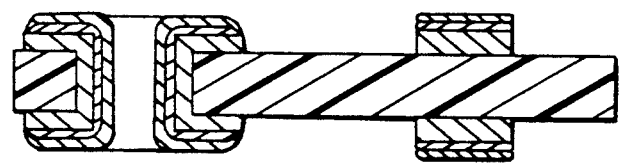

In an alternative embodiment shown in FIGS. 5a and 5b, the link layer 30 includes only link pads 32 and no link shield pads 36. One advantage of this embodiment is the ability to use interconnect alloys having a relatively higher flow as the potential for the creation of electrical shorts due to the lateral flow of the interconnect alloy from shield to shield connections has been eliminated. Although this arrangement will be adequate for certain applications, it should be recognized that because of the very small surface areas associated with interconnect pads 20 for high density area array interconnections, there will only be a limited amount of surface area available to provide the mechanical connection between adjacent subsections. In those situations where a stronger mechanical connection between adjacent subsections 10 is desired, the link shield pads 36 in combination with the shield pads 26 serve to significantly increase the surface area which can be used to mechanically interconnect adjacent subsections 10. By using the link shield pads 36 and shield pads 26, mechanical connection strengths between adjacent subsections can be as strong as or stronger than the prior art multilayer interconnect systems that bonded both the interconnect pads and the dielectric materials of adjacent layers together, such as the interconnect systems shown in U.S. Pat. Nos. 3,953,924 and 5,046,238.

Figure 6:
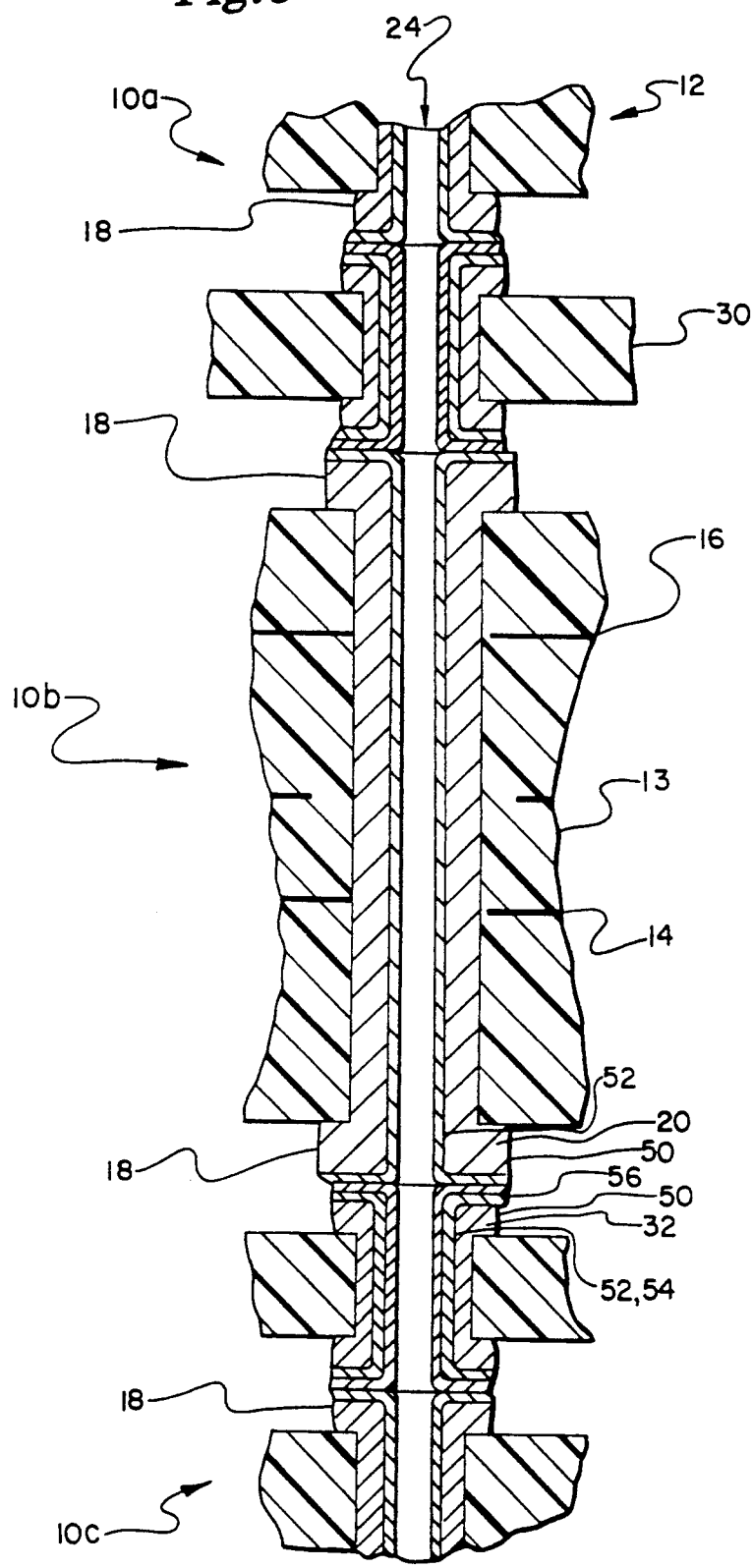
FIG. 6 is a more detailed cross section of a completed substrate of the preferred embodiment.

Referring now to FIG. 6, a more detailed cross section of a single plated-through hole for a multilayer substrate 12 having three subsections 10a, 10b and 10c laminated together is shown. In this embodiment, each of the subsections 10a, 10b and 10c is comprised of four laminated substrates each having a power layer 14 and an X-Y signal pair layers 16, with a pad layer 18 on each surface of the subsection 10. The first and third substrates are a 14 layer stripline construction as outer substrates and the second substrate include tree subsections that are each a 12 layer dual stripline construction. The planar dielectric 13 of each of the four laminated substrates is a thermoplastic fluoropolymer composite, such as RO2800, available from Rogers Corp. The subsection 10 is assembled using conventional PWB multilayer circuit board construction techniques, or in the manner as taught by U.S. Pat. No. 5,046,238. A thermoplastic fluoropolymer composite is used as the substrate material in the preferred embodiment because of the dimensional stability and Z-axis tolerancing of this material. In addition, it has been observed that a substrate formed from a thermoplastic fluoropolymer composite has better electrical characteristics and can accommodate the relatively high pressures involved in the process of the present invention by differential densification in response to the varying densities of the different thickness starting materials that comprise the subsection 10. Although a thermoplastic fluoropolymer composite is used as the substrate material, it will also be recognized that other substrate materials such as thermoset organic materials, or even inorganic materials such as ceramic or multilayer glass may also be used in accordance with the present invention.

In the preferred embodiment as shown in FIG. 6, each of the interconnect pads 20 is comprised of a base metal layer 50 with a top surface metal layer 52. The link pads 32 are also comprised of a base metal layer 50 with a top surface metal layer 52 onto which is deposited a donor metal 54. In an alternative embodiment that does not use the link layer 30, the surfaces of one or both of the conductive pad layers 18 are provided with the donor metal 54 just prior to assembly of the substrate 12. In the preferred embodiment, the base metal layers 50 for both the conductive pad layer 18 and the link layer 30 are 20 $\mu$m of Cu and the top surface metal layers 52 are 5 $\mu$m Au, with the donor metal 54 being 0.75 $\mu$m Sn.

Figure 7:
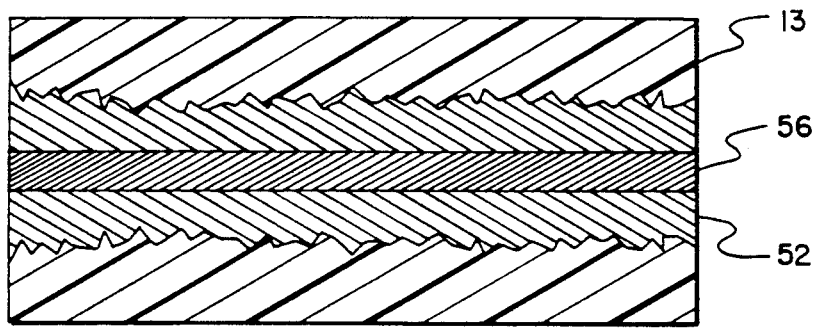
FIG. 7 is an enlarged cross section of a single joint of the preferred embodiment.

As shown in FIG. 7, during the bonding process of the present invention these metals are joined ultimately forming a solid solution by using an appropriate heat and pressure cycle that minimizes the potential formation of intermediate compositions resulting in an intermediate liquid phase either at or below the eutectic point of an interconnect alloy to be formed by the donor metal 54 and the top surface metal layer 52. The result is the creation of an electrical and mechanical metallurgical joint 56 by means of the solid state diffusion of the donor metal 54 into the top surface metal layer 52. As can be seen, the resulting joint 56 is essentially an entirely homogenous alloy that in the preferred embodiment has a weight ratio of Au:Sn=97:3. The joint 56 that is created by this process is a very predictable homogenous alloy that has a joint reliability in excess of 99.99%, as well as, excellent bond strength. The joint 56 also possesses electrical and mechanical characteristics that are far superior to any mechanical-type of interconnect system, especially with respect to the very low resistance of the joint 56, typically less than 1 milliohm. An additional advantage is that the use of solid state diffusion to create the joints 56 helps to overcome some of the upstream and downstream limitations imposed by prior art flow-type interconnect systems. It will be recognized that many different combinations of metallurgies can be used for the interconnect alloy and remain within the spirit of the present invention so long as such metallurgical combinations provide the desired solid state diffusion when subjected to heat and pressure that eliminate potential intermediate liquid phase essentially at or below the eutectic point of an interconnect alloy creating the electrical and mechanical bonding of the interconnect pads 20 in order to produce the metallurgical joints 56.

Figure 8:
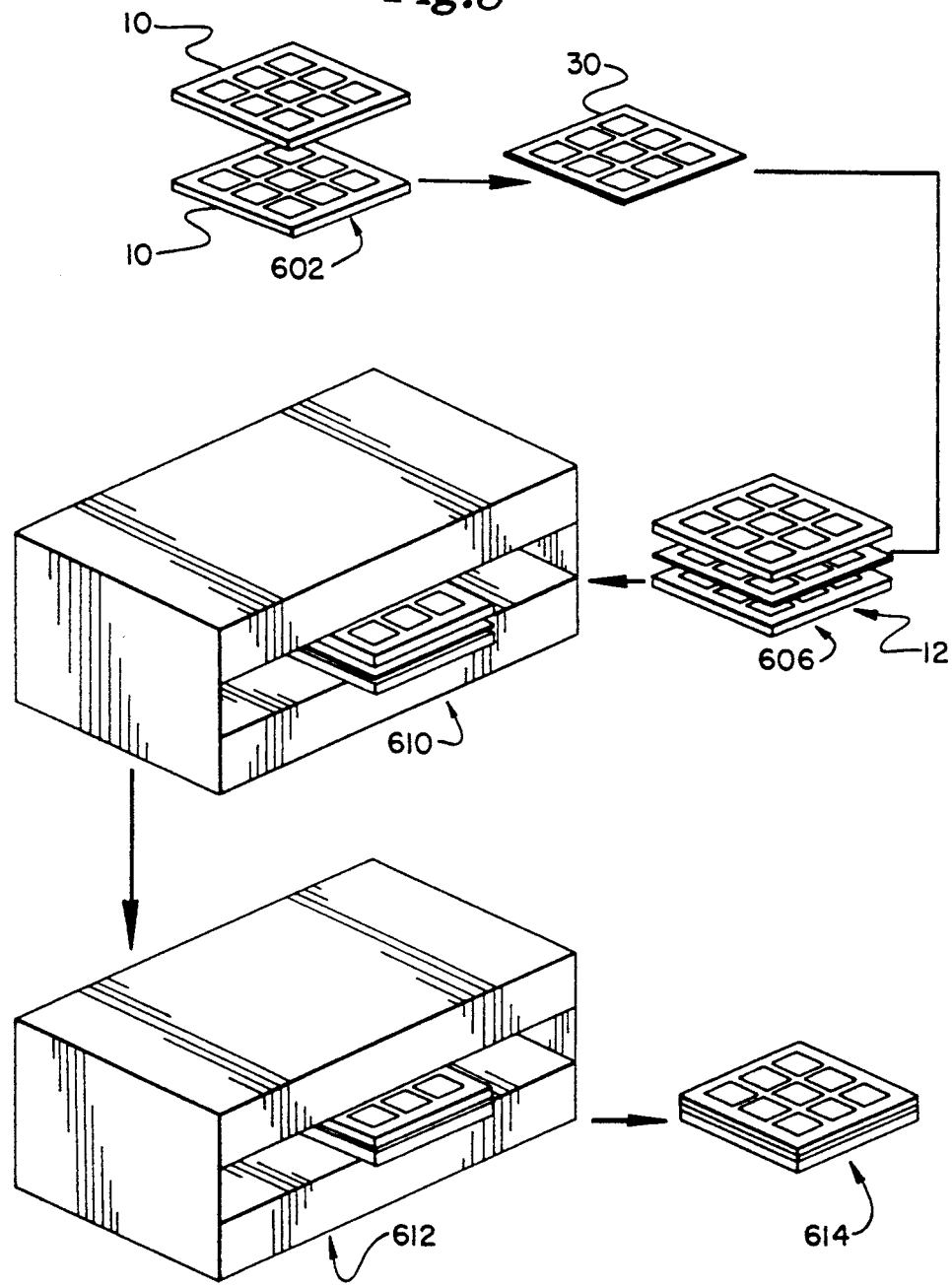
FIG. 8 is a pictorial diagram of the process steps of the preferred embodiment of the method of the present invention.
Figure 9:
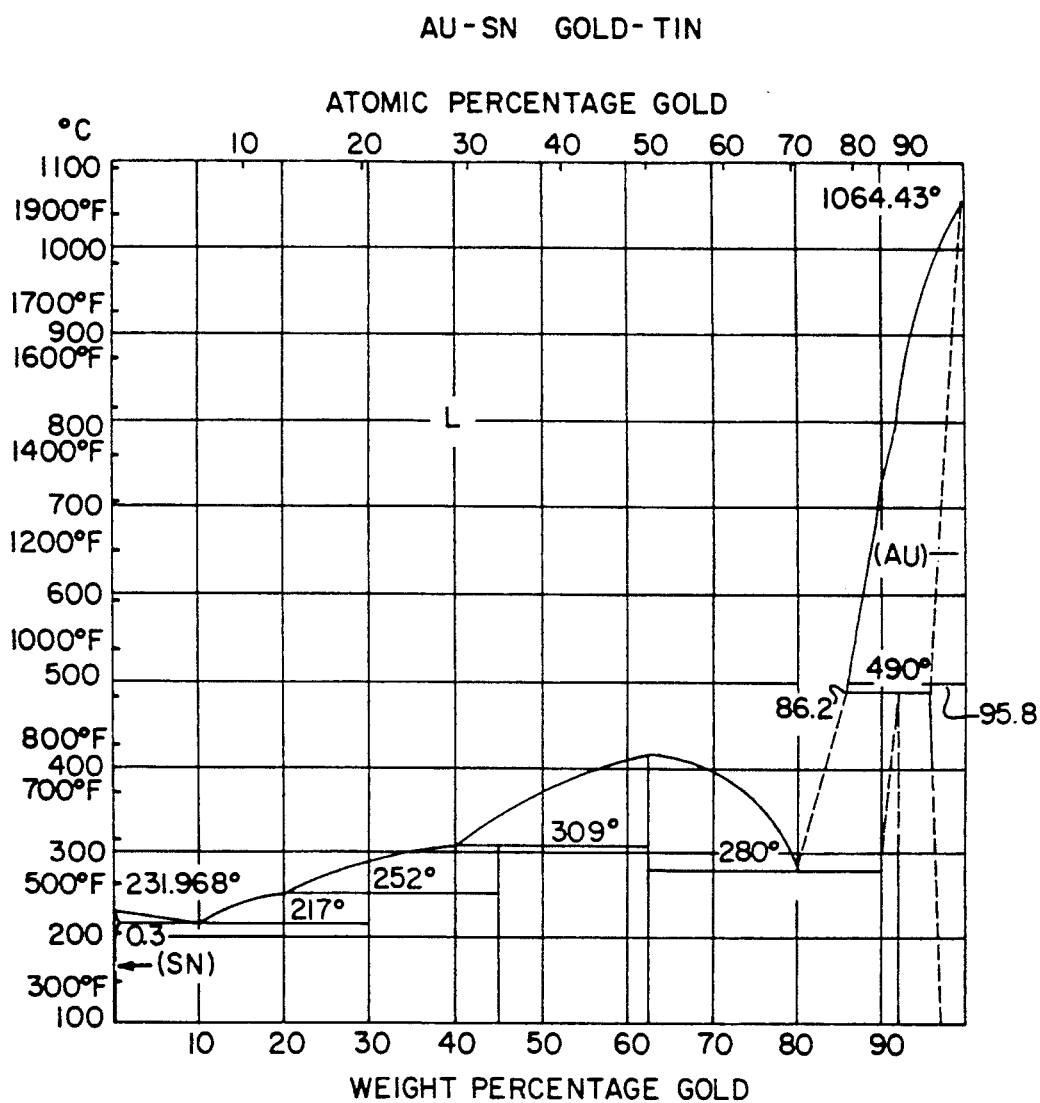
FIG. 9 is a phase diagram of Au-Sn (Gold-Tin) as a function of temperature.

Referring now to FIG. 8, the solid state diffusion process and the bonding metallurgy of the preferred embodiment of the present invention will be described in greater detail. The metallurgical joints 56 are preferably created using a solid state diffusion process, to join the donor metal layer 54 and the top surface metal layer 52 without bonding the surrounding dielectric substrate 13. The present invention utilizes a solid state diffusion process or solid phase bonding effectively below the eutectic or peritectic points of a low flow interconnect alloy to create the joints 56 of the interconnect system in order to prevent the conductive material of the joints 56 from flowing laterally to short adjacent interconnect areas when the temperature and pressure of the interconnect process surpasses a potential intermediate semi-liquid phase of the conductive material. It will be recognized that under severe processing heating rates for some interconnect alloys, a small portion of the interconnect alloy may momentarily be in a temporary liquid phase; however, the physical dimensions of the joint would not change because not all of the interconnect alloy of the joint would be in a liquid phase. For purposes of the present invention, a transient semi-liquid phase is defined as a physical state where some portion, but not all, of the low flow interconnect alloy of the joint 56 is in a liquid phase for a duration of time that is sufficiently short enough that the physical dimensions and shape of the joint 56 are not substantially altered.

It will be recognized that the concepts involved in the solid phase bonding of metals are well known, as described, for example, in Tu, K. and Rosenberg, R., "Room Temperature Interaction in Bimetallic Thin Film Couples", *Japan Journal of Applied Physics*, Suppl. 2, Pt. 1 (1974), pgs. 633–636, and Buene, L., "Characterization of Evaporated Gold-Tin Films", *Thin Solid Films*, 43 (1977) Netherlands, pgs. 285–294. It will also be recognized that various types of solid phase bonding or thermocompression bonding techniques have been used in the prior art on a chip-level to electrically bond integrated circuits to packages or substrates, as shown for example in U.S. Pat. Nos. 3,939,559, 4,332,341 and 4,875,617. All of these techniques, however, use a plurality of individual, preformed gold or solder bumps or specially shaped leads which are electrically bonded to individual contact pads on the integrated circuit using various combinations of heat and pressure above the eutectic point of the particular conductive material. As a result, these techniques are not applicable to large area, high density, multilayer area array interconnect systems, in part because of the significant Z-axis tolerancing problem caused by individual variations among the individual gold or solder bumps or specially shaped leads. It will also be seen that the Au:Sn ratio of the preferred embodiment is substantially different than the 80:20 Au:Sn ratio taught by these prior art reference, and that the present invention does not provide for the effectively infinite reservoir of what amounts to the top metal layer 52 (i.e., Au) used in some prior art systems.

In contrast to these prior art techniques, the present invention uses the solid state diffusion process shown in FIG. 8 to create both electrical and mechanical metallurgical joints 56 for a multitude of uniform height interconnect pads 20 that are populated over a large area thermoplastic fluoropolymer composite substrate to provide a relatively planar interconnect system that alleviates most of the problems of Z-axis tolerancing. The problems of Z-axis tolerancing are also addressed in the preferred embodiment by the use of the shield pads 26 and link shield pads 36 to create a relatively large bonding area. Additionally, larger non-signal pads 23 can be interspersed over the surface of the conductive pad layer 18 in order to create larger bonding areas within the perimeter of the shield pads 26 to aid in Z-axis tolerancing. As discussed above, in the preferred embodiment, the majority of the mechanical strength of the interconnect system is also achieved by bonding the relatively large area of the shield pads 26 with the link shield pads 36.

Basically, the process of the present invention involves the creation of the subsections 10 at Step 602, (as shown parenthetically in FIG. 8) the formation of the link layers at Step 604, the assembly of the unjoined substrate 12 at Step 606, the application of heat and pressure to allow for the solid state diffusion of the metallurgies to create the joints 56 at Step 610, the uses of a relaxation cycle at Step 612 to minimize the residual mechanical stresses introduced into the substrate 12 as a result of Step 610, and a final optional process at Step 614 of any additional mounting surface processing that may be necessary to prepare the top surface of the substrate 112 to accept surface mounting of integrated circuits or multichip modules, for example. Each of these steps is described in greater detail hereinafter.

As previously described, Step 602 can be accomplished using any number of well-known processes to create a multilayer circuit board that will be used as the subsection 10. The only requirement is that the mating surfaces of the subsection 10 be provided with a conductive pad layer 18 having the interconnect pads 20 of the desired metallurgies in order to perform the solid state diffusion at Step 610.

Step 604 involves the creation of the link layer 30. In the preferred embodiment, the link layer 30 starts with a copper clad dielectric 0.002" thick with the copper cladding being 0.0005" thick on each side. By using a masking and $CO_2$ laser etching process, the patterns of through-holes for the link pads 32 in the dielectric material 34 are established on each side. Once the through-holes are etched, copper is plated into each through-hole and the link pads 32 are placed on each side of the through-hole using a semi-additive metalization process whereby the base metal 50, the top surface metal 52 and the donor metal 54 are deposited in sequence on the link pads 32. An etching material that will not attack the tin donor metal 54, but will etch the surrounding copper clad layer, is used to remove the copper clad layer down to the dielectric material, thereby creating the uniform height differential between the link pads 32 and the surrounding dielectric medium 34. The result is a sheet of "floating rivets" surrounded by a link shield pad, as shown for example in FIG. 4a.

In Step 606, the multiple layers of the substrate 12 are aligned using traditional alignment procedures. In the preferred embodiment, an optical alignment technology is used to align fiducials or registration marks on each layer. Alternatively, a mechanical pinning alignment or any similar type of alignment procedure could be used.

Step 610 uses the high temperature electrical heat-press previously described to generate the temperatures and pressures necessary to bond the metallurgies without forming an intermediate eutectic composition of the conductive materials. In the preferred embodiment, the 97:3 Au:Sn metallurgy is processed at 425°-575° F. @ 100-2500 PSI for a period of 30-90 minutes. It should be noted that temperatures below 425° F. are theoretically possible, however, superior join strengths have been achieved at the higher temperatures. It will be recognized that various combinations of subsection construction, temperature, pressure, and stress relief will result in various joint strengths for the joint 56. In general, the best approach is to form the joints 56 at or just below the yield strength of the composite material being used as the planar dielectric 13. In the preferred embodiment, the RO2800 dielectric subsections totalling 0.150-0.250 inches of Z-axis height are processed at 500° F. and 700 PSI for a period of 60 minutes. A 12 hour stress relief cycle at 500° F. is employed to improved joint reliability. The stress relief is accomplished by uniformly reducing pressure from 700 PSI to 50 PSI within 4 hours, followed by an 8 hour anneal process.

The preferred embodiment uses an Au-Sn alloy for the interconnect alloy. It will also be recognized that other possible low flow interconnect alloys could be used in combination with the present invention, including without limitation: Pb:Sn/Pb, Pb:Pb, Sn:Sn, Au:Pb, Au:In, Ag:In, Ag:Pb, Cu:Sn, Ag:Sn, or Pb:Sn. For the preferred metallurgy, the vast majority of the solid state diffusion is accomplished above 300° F. by the diffusion of Sn into Au, although there will be some inter-diffusion between the Au and the Sn even at temperatures as low as 75° F. It will also be noted that in the preferred embodiment, a small amount of the Cu base metal 50 may also diffuse into the joint 56 at temperatures above 500° F. It has been found that such diffusion is not sufficient to create any brittle intermetallics. In particular, Au:Sn ratios between 93:7 and 99.5:.5 by weight will provide the best results in terms of temperature and pressure requirements for the solid phase bonding. As previously discussed, although Au:Sn ratios in this range will produce solid state diffusion of the metallurgies, the physical nature of the interconnect alloy at any precise moment is process dependent and may not be entirely in the solid phase if excessively rapid heating rates are employed. All that is required for the present invention to be useful is that the joining process of Step 606 be accomplished by creating no more than an intermediate semi-liquid phase for the interconnect alloy of the joint 56. It has been found that the use of the Au:Sn ratios above 93:7 using conventional electrical presses at heating rates of 1°-20° F./minute results in no observable flow for the interconnect alloy of the joint 56. As a result, it is possible to allow for shield-to-shield and ground-to-ground interconnects in relatively close proximity to signal-to-signal interconnects as the potential for any lateral flow of the conductive material that might short adjacent interconnect pads 20 is almost non-existent.

The ability to create the joint 56 below or very near the eutectic or peritectic points of the conductive material is advantageous for a number of reasons. First, by making the joints 56 below the eutectic point of the conductive material, the joints are also created below the melting point of the dielectric material 13. This aids in the Z-axis tolerancing of the interconnect system because of the variation in the coefficient of thermal expansion of most dielectric materials above their melt points. For example, for the thermoplastic fluoropolymer composite of the preferred embodiment, this material will expand by approximately 15-20% above the melt temperature of the material (approx. 621° F.). This expansion leads to greater Z-axis tolerancing problems and potential stress relief problems. Second, by creating joints 56 well above the eutectic composition of the conductive material, the joints 56 will not melt and refuse during subsequent processing when such downstream processes require the use of high temperature solders, for example.

In Step 612, stress relief procedures are applied to the substrate 12 in order to minimize the potential for opens due to the variations in Z-axis tolerancing, relative cross-sectional modulis and coefficients of thermal expansions of the materials in the substrate creating residual mechanical stress during Step 610. Table I shows the processing requirements and bond strength dependencies for the RO2800 dielectric and 97:3 Au:Sn multilayer area array interconnect system of the preferred embodiment given conventional PWB cross-sections and interconnect pads of approximately 0.095 sq. mm.

TABLE I

| PWB Thickness | Number of Interconnect Interfaces | Joining Pressure (psi) | Approx. Bond Shear Strength (grams) | Stress Relief Requirement |
|---|---|---|---|---|
| <.050" | 2-10 | <500 | 50-90 | No |
|  | 2-10 | 500-2500 | 90+ | No |
| .050-.100" | 2-4 | 250-500 | 5-30 | No |
|  | 2-4 | 750-2500 | 90+ | No |
| .100-.150" | 4-10 | <500 | 5-30 | No |
|  | 4-10 | 600-900 | 30-100+ | Yes |
| .150-.250" | 8-12 | <500 | 5-90 | Yes |
|  | 8-12 | 600-750 | 30-100+ | Yes |

In Step 614, additional top surface preparation can be added to the completed substrate to prepare the substrate for receiving surface mount integrated circuits or multichip module, for example. As will be appreciated, a wide variety of top surface preparation procedures may be applied to the completed substrate 12 in a manner well known in the prior art.

Although the description of the preferred embodiment has been presented, it is contemplated that various changes could be made without deviating from the spirit of the present invention. Accordingly, it is intended that the scope of the present invention be dictated by the appended claims, rather than by the description of the preferred embodiment.

What is claimed is:

1. A method for forming a multilayer substrate having high density area array interconnects, the method comprising the steps of:
   (a) providing three or more pre-assembled subsections, each subsection comprising:
      a planar substrate having a pair of generally planar exposed surfaces and being comprised of a dielectric medium having a plurality of conductive layers disposed therein, the conductive layers including:
         at least one power layer; and
         at least one X-Y signal pair layer; and
      a pad layer on at least one of the surfaces of the planar substrate, the pad layer comprising a plurality of metallic interconnect pads disposed on the surface of the planar substrate such that an exposed surface of the interconnect pads is raised above the exposed surface of the dielectric medium surrounding the interconnect pads, each of the interconnect pads being selectively connected to one or more conductive regions in the signal pair layer or the power layer;
   (b) stacking the three or more pre-assembled subsections together such that the interconnect pads on the pad layer of one subsection align with the interconnect pads on the pad layer of an adjacent subsection; and
   (c) electrically and mechanically joining the three or more pre-assembled subsections in a simultaneous manner to concurrently form the multilayer substrate by metallurgically bonding the interconnect pads on adjacent subsections without bonding the surrounding dielectric medium.

2. The method of claim 1 wherein the pad layer further comprises one or more metallic shield pads surrounded by the dielectric medium, the metallic shield pads having an exposed surface that is substantially larger in area than an area of the exposed surface of one of the interconnect pads, and that is higher than the exposed surface of the dielectric medium, each of the shield pads being selectively connected to one or more metallic regions in the power layer.

3. The method of claim 2 wherein one of the shield pads is a generally continuous shield pad that defines a periphery region that completely surrounds a perimeter of the pad layer to effectively seal the interconnect pads from outside contaminants after the subsections are joined together to form the multilayer substrate.

4. The method of claim 1 wherein step (a) further comprises the step of testing the pre-assembled subsections by applying electrical test signals to one or more of the interconnect pads to test an electrical signal path in the subsection associated with the one or more interconnect pads.

5. The method of claim 1 wherein step (c) is accomplished by solid state diffusion using heat and pressure such that a thermally stable electrical and mechanical interconnect is formed between adjacent interconnect pads at a temperature and pressure combination that is essentially below the eutectic point of the metallic interconnect pad.

6. The method of claim 5 wherein the exposed surface of the interconnect pads is gold having a thin layer of tin disposed thereon.

7. The method of claim 6 wherein the interconnects are formed by solid state diffusion of a metallic interconnect alloy having a Au:Sn ratio of approximately 97:3 by weight.

8. The method of claim 5 wherein step (c) is accomplished at a temperature and pressure combination at or just below the yield strength of the planar substrate.

9. The method of claim 5 further comprising the step of:
   (d) relaxing one or more mechanical stresses introduced into the interconnect pads by step (c) by cycling the multilayer substrate through one or more reduced temperature and pressure cycles wherein the temperature and pressure combination of each cycle is less than or equal to the temperature and pressure combination used to form the thermally stable electrical and mechanical interconnect.

10. A method for forming a multilayer substrate having high density area array interconnects, the method comprising the steps of:
    (a) providing two or more pre-assembled subsections, each subsection comprising:
       a planar substrate having a pair of generally planar exposed surfaces and being comprised of a dielectric medium having a plurality of conductive layers disposed therein, the conductive layers including:
          at least one power layer; and
          at least one X-Y signal pair layer; and
       a pad layer on at least one of the surfaces of the planar substrate, the pad layer comprising a plurality of metallic interconnect pads disposed on the surface of the planar substrate such that an exposed surface if the interconnect pads is raised above the exposed surface of the dielectric medium surrounding the interconnect pads, each of the interconnect pads being selectively connected to one or more conductive regions in the signal pair layer or the power layer;
    (b) providing one or more link layers, each of the link layers each comprising a planar sheet of dielectric material having a pair of generally planar exposed surfaces and a plurality of metallic link pads disposed on the surface of the planar sheet such that an exposed surface of the link pads is raised above the exposed surface of the dielectric material surrounding the link pads and the metallic link pads selectively correspond to interconnect pads on two adjacent subsections which are to be joined;
    (c) stacking two or more of the pre-assembled subsections together in a sandwiched arrangement with a link layer interposed between any two adjacent subsections such that the interconnect pads on the pad layer of one of the two adjacent subsections align with the interconnect pads on the pad layer of the other of the adjacent subsection and the link pads of the link layer interposed therebetween; and
    (d) electrically and mechanically joining the two or more pre-assembled subsections and corresponding link layers to form the multilayer substrate by metallurgically bonding the corresponding interconnect pads and link pads on adjacent subsections and link layers.

11. The method of claim 10 wherein step (d) is accomplished concurrently without bonding the surrounding dielectric medium of the adjacent subsections and the dielectric material of the link layer.

12. The method of claim 10 wherein the pad layer of the subsection further comprises one or more metallic shield pads having an exposed surface that is substantially larger in area than an area of the exposed surface of one of the interconnect pads, and that is higher than the exposed surface of the dielectric medium, each of the shield pads being selectively connected to one or more metallic regions in the power layer, and wherein the link layer further comprises one or more metallic shield link pads surrounded by the dielectric material of the link layer and corresponding to the shield pads of the subsection, the link shield pads having an exposed surface that is substantially larger in area than one of the link pads, and that is higher than the exposed surface of the dielectric material of the link layer.

13. The method of claim 12 wherein one of the shield pads is a generally continuous shield pad that defines a periphery region completely around a perimeter of the pad layer and one of the shield link pads is a corresponding generally continuous link shield pad that defines a periphery region that completely surrounds a perimeter of the link layer to effectively seal the interconnect pads and the link pads from outside contaminants after the subsections are joined together to form the multilayer substrate.

14. The method of claim 10 wherein step (a) further comprises the step of testing the pre-assembled subsections by applying electrical test signals to one or more of the interconnect pads to test an electrical signal path in the subsection associated with the one or more interconnect pads.

15. The method of claim 10 wherein step (d) is accomplished using heat and pressure such that a thermally stable electrical and mechanical interconnect between corresponding interconnect pads and links pads and between corresponding shield pads and link shield pads is formed between adjacent interconnect pads at a temperature and pressure combination that is essentially below the eutectic point of the metallic interconnect pad and the metallic link pad.

16. The method of claim 15 wherein step (d) is accomplished at a temperature and pressure combination at or just below the yield strength of the planar substrate.

17. The method of claim 16 further comprising the step of:
(e) relaxing one or more mechanical stresses introduced into the interconnect pads by step (d) by cycling the multilayer substrate through one or more reduced temperature and pressure cycles wherein the temperature and pressure combination of each cycle is less than or equal to the temperature and pressure combination used to form the thermally stable electrical and mechanical interconnect.

18. The method of claim 16 wherein the exposed surface of the interconnect pads and shield pads is comprised of a metal which is resistent to oxidation and the exposed surfaces of the link pads and shield link pads are comprised of a metal which is less resistent to oxidation than the metal of the exposed surface of the interconnect pads and shield pads.

19. The method of claim 18 wherein the exposed surface of the interconnect pads and shield pads is gold and the exposed surfaces of the link pads and shield link pads are tin.

20. The method of claim 19 wherein the interconnects are formed by solid state diffusion of a metallic interconnect alloy having a Au:Sn ratio of approximately 97:3.

21. A method of making a multilayer electronic circuit comprising the steps of:
(a) providing at least a first, second and third subsection, each subsection comprised of a planar sheet of dielectric material having conductive metal connect pads formed on at least one surface of the planar sheet, the connect pads being raised above the surface of the planar sheet;
(b) stacking the first, second and third subsections one on top of the other so that the connect pads are selectively aligned; and
(c) simultaneously laminating the stacked subsections together under heat and pressure to form the multilayer electronic circuit by creating a mechanical and electrical metallurgical bond between corresponding connect pads of the first and second subsections by solid phase bonding of the corresponding connect pads at a temperature and pressure combination that is essentially below the eutectic point to the metallurgical bond without bonding the surrounding dielectric material of the first and second subsections.

22. The method of claim 21 wherein the connect pads are positioned on the surface of the planar sheet at a pitch of less than 0.050 inches.

23. The method of claim 21 wherein the first and second substrate are formed as a substrate having a 12 layer dual stripline construction and the third layer is formed as a substrate having a 14 layer stripline construction.

24. The method of claim 21 wherein the shape of the connect pads is generally hexagonal.

25. The method of claim 21 wherein the shape of some of the connect pads which are associated with a plated through-hole is a tab shape with one end of the tab shape surrounding the plated through-hole and the opposite end of the tab shape positioned on an adjacent area of the surface of the dielectric material.

26. A method for forming a high density area array interconnect comprising the steps of:
(a) providing a first dielectric substrate surface having plurality of metallic interconnect areas, each interconnect area comprising a base metal layer and a top metal layer such that the height of the top metal layer is a uniform height above the substrate surface;
(b) providing a second dielectric substrate surface having plurality of metallic interconnect areas, each interconnect area comprising a base metal layer and a top metal layer and a donor metal layer such that the height of the donor metal layer is a uniform height above the substrate surface;
(c) stacking the first and second substrates such that corresponding interconnect areas are aligned; and
(d) applying heat and pressure to the stacked first and second substrates in a manner sufficient to metallurgically create an interconnect alloy comprised of the donor metal layer of the second substrate and the top metal layer of the first substrate at a pressure and temperature combination that is essentially less than the eutectic point of the interconnect alloy, whereby a homogenous alloy joint is formed for each interconnect area.

27. The method of claim 26 wherein the base metal layer is Cu, the top metal layer is Au, and the donor metal layer is Sn.

28. The method of claim 27 wherein the Au:Sn alloy is between 93:7 and 99.5:0.5 ratio by weight.

29. The method of claim 28 wherein the Au:Sn alloy is 97:3 ratio by weight.

* * * * *

UNITED STATES PATENT AND TRADEMARK OFFICE
CERTIFICATE OF CORRECTION

PATENT NO. : 5,276,955
DATED : January 11, 1994
INVENTOR(S) : David B. Noddin et al.

It is certified that error appears in the above-indentified patent and that said Letters Patent is hereby corrected as shown below:

Column 1, page 2, item [56],

Other Publications, please delete "Electronics Packaing" and insert

--Electronics Packaging--.

Signed and Sealed this

Eleventh Day of November, 1997

*Attest:*

BRUCE LEHMAN

*Attesting Officer*   Commissioner of Patents and Trademarks